United States Patent [19]
Otsuka et al.

[11] Patent Number: 5,607,878
[45] Date of Patent: Mar. 4, 1997

[54] CONTACT PLUG FORMING METHOD

[75] Inventors: Mari Otsuka, Kawasaki; Tomonori Kitakura, Yokohama; Kenichi Otsuka; Kazuya Mori, both of Kawasaki, all of Japan

[73] Assignee: Kabushiki Kaisha Toshiba, Kawasaki, Japan

[21] Appl. No.: 526,543

[22] Filed: Sep. 12, 1995

Related U.S. Application Data

[63] Continuation of Ser. No. 322,289, Oct. 13, 1994, abandoned.

[30] Foreign Application Priority Data

Oct. 14, 1993 [JP] Japan .................................. 5-280619

[51] Int. Cl.⁶ .................................................. H01L 21/28
[52] U.S. Cl. .......................... 437/187; 437/192; 437/195; 437/245; 148/DIG. 17
[58] Field of Search ..................................... 437/187, 192, 437/245, 946, 195; 148/DIG. 17

[56] References Cited

U.S. PATENT DOCUMENTS

| | | | |
|---|---|---|---|
| 4,804,560 | 2/1989 | Shioya | 437/192 |
| 4,902,645 | 2/1990 | Ohba | 437/195 |
| 4,985,372 | 1/1991 | Narita | 437/946 |
| 5,037,775 | 8/1991 | Reisman | 437/192 |
| 5,043,299 | 8/1991 | Chang et al. | 437/192 |
| 5,201,995 | 4/1993 | Reisman | 437/245 |

FOREIGN PATENT DOCUMENTS 61-248525   3/1987   Japan .

OTHER PUBLICATIONS

S. Wolf "Silicon Processing for the VLSI Era: vol. 1", Lattice Press, 1986, pp. 547–550.

"Tungsten Selective CVD and Its Applications to VLSI Metallization", Hitoshi Itoh et al., ULSI Research Center, 28(1):48–54 (1989).

*Primary Examiner*—John Niebling
*Assistant Examiner*—Thomas G. Bilodeau
*Attorney, Agent, or Firm*—Finnegan, Henderson, Farabow, Garrett & Dunner, L.L.P.

[57] ABSTRACT

An inter-level insulation film is formed on a first-level interconnection layer and part of the inter-level insulation film which lies on the first-level interconnection layer is etched to form a contact hole. After a natural oxidation film formed on the surface of part of the first-level interconnection layer which is exposed in the contact hole is removed, the resultant structure is exposed to a gas atmosphere containing halogen to purify the surface of the inter-level insulation film. After this, a contact plug is deposited and formed on the first-level interconnection layer which is exposed in the contact hole by the selective CVD method to fill in the contact hole. A second-level interconnection layer is formed on the inter-level insulation film and the first-level and second-level interconnection layers are electrically connected to each other via the contact plug.

19 Claims, 6 Drawing Sheets

CONTACT PLUG FORMING METHOD

This application is a continuation of application Ser. No. 08/322,289, filed Oct. 13, 1994, now abandoned.

BACKGROUND OF THE INVENTION

1. Field of the Invention

This invention relates to a method for manufacturing semiconductor devices, and more particularly to a method for forming contact plugs filled in contact holes formed in an insulation film for connection between interconnection layers.

2. Description of the Related Art

As semiconductor devices such as ICs and LSIs are more miniaturized, the tendency of the interconnection layer structure to be made in a multi-layered form becomes more significant. In the multi-level interconnection, several techniques for connecting the interconnection layers to each other are realized. As one of the techniques, a technique for forming a contact hole in an inter-level insulation film formed between the interconnection layers and filling an electrically conductive material called a plug (contact plug) of tungsten, for example, in the contact holes by the CVD (Chemical Vapor Deposition) method to electrically connect the interconnection layers to each other is known in the art. A method for growing the electrically conductive material only in the contact hole (which is hereinafter referred to as selective CVD) has an advantage that a metal film acting as an interconnection layer can be planarize since the plug is filled in the contact hole and therefore the method is often used. The above-described technique for filling the contact plug in the contact hole to connect the interconnection layers to each other is disclosed in NIHON KINZOKU GAKKAI (Institute of Metal of Japan) Proceeding Paper, vol. 28, No. 1 (1989), pp. 48 to 54, for example.

When a plug is filled into a contact hole formed in the inter-level insulation film to connect the first-level interconnection layer and second-level interconnection layer formed on the semiconductor substrate to each other, it is necessary to eliminate a natural oxidation film formed on that portion of the first-level interconnection layer which is exposed in the contact hole as the preprocessing. Therefore, for example, after the natural oxidation film is eliminated by effecting the plasma etching by use of a gas containing halogen such as $BCl_3$, a plug of tungsten (W) or the like is filled only in the contact hole without depositing the plug material on the inter-level insulation film.

However, with the above method, if the temperature of the semiconductor substrate is high or something which acts as a core for deposition of the plug material of tungsten or the like lies on the surface of the inter-level insulation film at the time of selective growth, the plug material will be deposited not only in the contact hole but also on the inter-level insulation film. For example, when $WF_6$ is reduced by $SiH_4$, tungsten is deposited on the interconnection material in the contact hole, and at the same time, tungsten grows from the above core and deposited on the inter-level insulation film around the contact hole.

Figure 1:
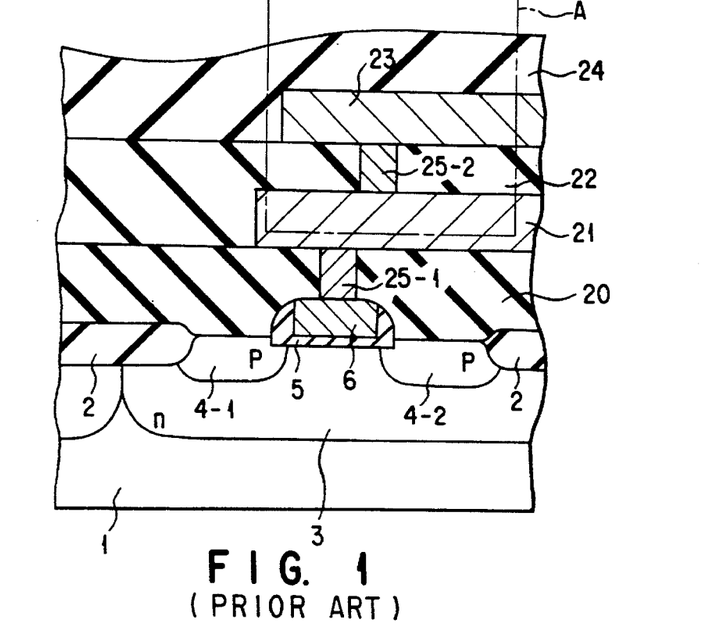
FIG. 1 is a cross sectional view showing a conventional semiconductor device.

The interconnection structure in the conventional semiconductor device is explained in detail with reference to FIG. 1. For example, a P-type silicon substrate is used as a semiconductor substrate 1 and a field oxide film 2 is formed as an element isolation region on the surface of the semiconductor substrate 1. For example, an N well region 3 is formed in that portion of the semiconductor substrate 1 which lies in the element region and P-type source and drain regions 4-1, 4-2 which act as active regions of a transistor are formed in the N well region 3. A gate oxide film 5 is formed on the channel region between the source and drain regions 4-1 and 4-2 and a polysilicon gate 6 is formed on the gate oxide film 5. On the resultant structure, a first-level inter-level insulation film 20 which is formed of a BPSG (boro-phospho silicate glass) film, TEOS (tetraethyl orthosilicate) film formed by heat decomposition of organic oxirane or the like and whose surface is planarize by the heat treatment is formed. A first-level metal interconnection layer 21 formed of Al is formed on the inter-level insulation film 20. The metal interconnection layer 21 and inter-level insulation film 20 are covered with a second-level insulation insulation film 22 of BPSG or the like. The surface of the inter-level insulation film 22 is planarize by the heat treatment and a second-level metal interconnection layer 23 formed of Al or the like is formed thereon. The metal interconnection layer 23 is covered with and protected by a protection insulation film 24.

The polysilicon gate 6 and the first-level metal interconnection layer 21 are electrically connected to each other via a contact plug 25-1 formed of tungsten or the like and filled in a contact hole formed in the inter-level insulation film 20. Likewise, The first-level metal interconnection layer 21 and the second-level metal interconnection layer 23 are electrically connected to each other via a contact plug 25-2 formed of tungsten or the like and filled in a contact hole formed in the inter-level insulation film 22. The contact plugs 25-1 and 25-2 are formed by the selective CVD method as described before.

Figure 2A:
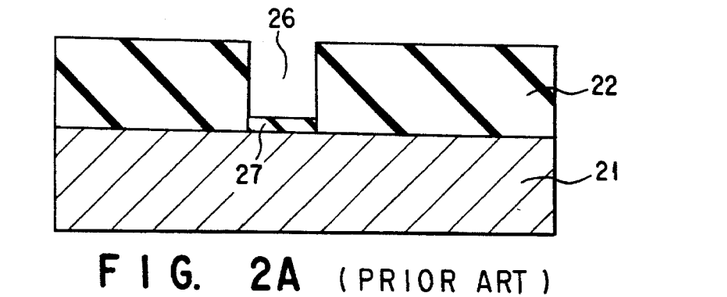
FIGS. 2A to 2D are cross sectional views sequentially showing the manufacturing steps of a multi-level interconnection structure section in the semiconductor device shown in FIG. 1, for illustrating the conventional contact plug forming method.

Next, a filling process of the contact plug 25-2 is explained with reference to FIGS. 2A to 2D. FIGS. 2A to 2D are cross sectional views sequentially showing the manufacturing steps of a multi-level interconnection structure section A surrounded by one-dot-dash lines in FIG. 1. First, as shown in FIG. 2A, Al is vapor-deposited on a semiconductor substrate (first-level inter-level insulation film 20) which is not shown in the drawing, and then the Al film is patterned to form the first-level metal interconnection layer 21. Next, the second-level inter-level insulation film 22 is formed to cover the interconnection layer 21. A contact hole 26 is formed in that portion of the inter-level insulation film 22 which lies on the metal interconnection layer 21 by the anisotropic etching method such as RIE so as to expose part of the surface of the metal interconnection layer 21 in the contact hole 26. At this time, a natural oxidation film 27 is formed on the exposed surface of the metal interconnection layer 21.

Figure 2B:
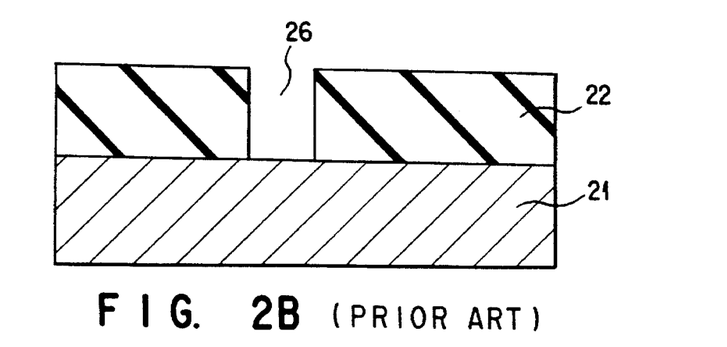

Next, the natural oxidation film on the first-level metal interconnection layer 21 is removed by the plasma etching using a gas containing halogen such as $BCL_3$ to obtain the structure shown in FIG. 2B.

Figure 2C:
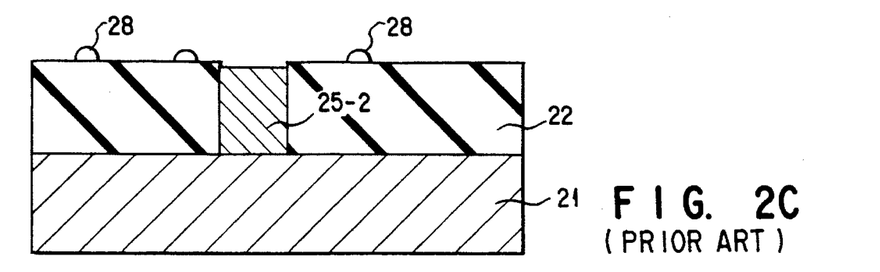
Figure 2D:
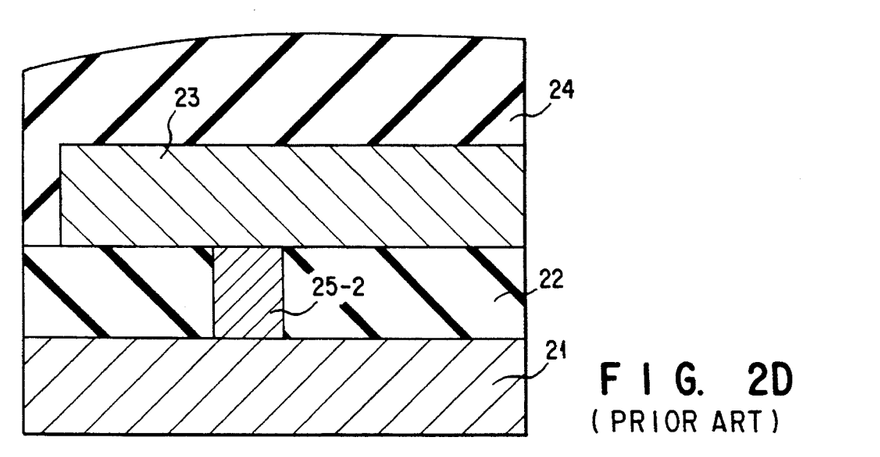

After the above process, tungsten is selectively grown on that part of the metal interconnection layer 21 which lies in the contact hole 26 by the reducing reaction of $WF_6$ so as to fill the contact plug 25-2 in the contact hole 26 (FIG. 2C). The selective CVD is based on the fact that the selectivity is caused by a difference in the material of a portion to be deposited and the reduction speed of halide of tungsten becomes extremely different if the material of the substrate surface is different. Generally, tungsten is deposited on a conductive material, but almost no tungsten is deposited on an insulation material.

Next, Al is vapor-deposited on the inter-level insulation film 22 and the Al film is patterned to form the second-level metal interconnection layer 23. The first-level metal interconnection layer 21 and the second-level metal interconnection layer 23 are electrically connected to each other via the contact plug 25-2. After this, an inter-level insulation film or protection insulation film 24 is formed on the resultant structure to obtain the interconnection structure shown in FIG. 2D.

However, if impurities are present on the surface of the inter-level insulation film 22 or the temperature of the semiconductor substrate is high when the selective CVD for forming the contact plug 25-2 is effected, a core (particle) 28 of tungsten is deposited on the surface of the inter-level insulation film 22 as shown in FIG. 2C. As a result, tungsten grows not only on the metal interconnection layer 21 in the contact hole 26 but also from the core 28, thereby making it impossible to maintain the above-described selectivity. In the CVD method, as the film formation temperature is higher, the growth speed becomes higher and the film quality becomes uniform, and it is advantageous, but if the contact plug is deposited at high temperatures of 200° to 400° C., it is also deposited on the insulation material. On the other hand, if the film formation temperature is lowered, the amount of deposition of the particles becomes less and the selectivity can be enhanced, but the film formation speed becomes low and time for the manufacturing process becomes longer and the film quality becomes non-uniform and contact defects tend to easily occur.

SUMMARY OF THE INVENTION

An object of this invention is to provide a contact plug forming method which makes it difficult to deposit plug material on an insulation film which is different from part of an interconnection layer lying in a contact hole.

Another object of this invention is to provide a contact plug forming method which can attain high selectivity even if the plug material is deposited at high temperatures.

Still another object of this invention is to provide a contact plug forming method by which a good contact characteristic between interconnection layers can be attained.

The above object of this invention can be attained by a semiconductor device manufacturing method which comprises a step of forming a first conductive layer; a step of forming an insulation film on the first conductive layer to cover the first conductive layer with the insulation film; a step of etching the insulation film on the first conductive layer to form a contact hole and expose the first conductive layer in the contact hole; a step of exposing the resultant structure to a gas atmosphere containing halogen; a step of depositing and forming a contact plug on the first conductive layer exposed in the contact hole by the selective CVD method to fill in the contact hole; and a step of forming a second conductive layer on the insulation film and electrically connecting the first and second conductive layers to each other via the contact plug.

By exposing the insulation film having the contact plug buried therein to the gas atmosphere containing halogen, the surface of the insulation film is purified, thereby making it difficult to create a core of plug material. Therefore, it becomes difficult for the plug material to be deposited on the insulation film which is different from part of the first conductive layer lying in the contact hole and the high selectivity can be attained even when the plug material is deposited at high temperatures. Further, since the plug material can be deposited at high temperatures, the film quality of the contact plug can be made uniform and a good contact characteristic between the conductive layers can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 3A:
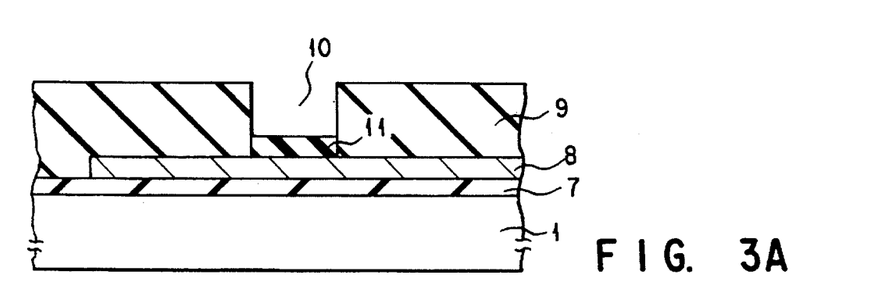
FIGS. 3A to 3D are cross sectional views sequentially showing the manufacturing steps of a multi-level interconnection structure section in a semiconductor device, for illustrating a contact plug forming method according to a first embodiment of this invention.

There will now be described a contact plug forming method according to a first embodiment of this invention with reference to FIGS. 3A to 3D. FIGS. 3A to 3D are cross sectional views sequentially showing the manufacturing steps of a multi-level interconnection structure section in a semiconductor device. As shown in FIG. 3A, an insulation film 7 such as an $SiO_2$ film is formed on a semiconductor substrate 1 such as a silicon substrate and a first-level interconnection layer 8 formed of polysilicon is formed on the insulation film 7. An inter-level insulation film 9 with a thickness of approx. 0.1 to 1 μm is formed on the insulation film 7 and interconnection layer 8. The inter-level insulation film 9 is formed of BPSG or the like and the surface thereof is planarize by the heat treatment. The fluidity of a phosphorus glass film of BPSG or PSG varies according to the amount of doped phosphorus at the time of heat treatment and the surface thereof can be easily planarize. A contact hole 10 is formed in part of the inter-level insulation film 9 which lies on the interconnection layer 8 by the anisotropic etching method such as RIE (Reactive Ion Etching). As a result, part of the first-level interconnection layer 8 which lies at the bottom of the contact hole 10 is exposed. A natural oxidation film 11 is formed on the exposed surface of the interconnection layer 8 at the time of etching as described before. Then, the plasma etching process using a gas containing halogen such as $BCl_3$ is effected to remove the natural oxidation film 11.

Figure 3B:
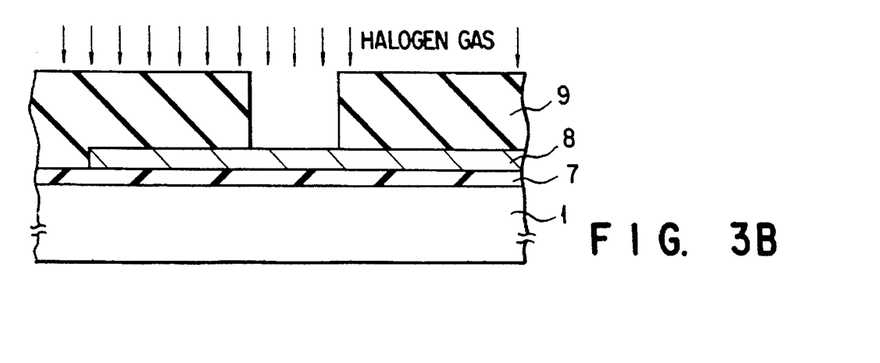

After this, as shown in FIG. 3B, the semiconductor substrate 1 is exposed to the gas atmosphere containing halogen. The temperature of the semiconductor substrate 1 at this time may be set in a range from the room temperature to approx. 400° C. If the temperature is kept in this range, the characteristic of the surface of the semiconductor substrate can be kept substantially at the same characteristic. More specifically, a halogen gas of 5 volume % is sprayed on the surface of the semiconductor substrate to be processed at a flow rate of approx. 100 to 800 sccm for approx. 10 to 50 sec. with inert gas used as a carrier gas. In this embodiment, $F_2$ gas is used as the gas containing halogen and He gas is used as the carrier gas, the process temperature is set at approx. 300° C., and $F_2$ gas of 5 volume % is sprayed on the surface of the semiconductor substrate (inter-level insulation film 9) to be processed at a flow rate of 200 sccm for approx. 30 sec. Thus, the surface of the inter-level insulation film (BPSG film) 9 is purified.

Figure 3C:
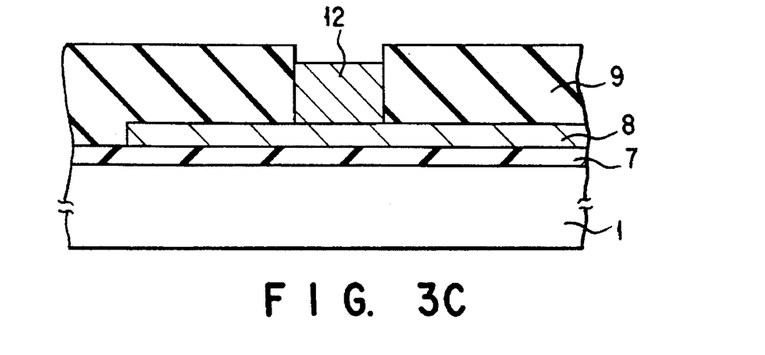

Next, as shown in FIG. 3C, tungsten is selectively grown on the first-level inter-level interconnection layer 8 in the contact hole 10 by the reducing reaction of W or $WF_6$ such as the reaction of $WF_6$ and $SiH_4$. The selective CVD is based on the fact that the selectivity is caused by a difference in the material of a portion to be deposited and the reduction speed of halide of tungsten such as $WF_6$ becomes extremely different if the material of the substrate surface is different. At this time, since the surface of the inter-level insulation film 9 is purified by the process using the $F_2$ gas, almost no tungsten is attached to the inter-level insulation film 9 and tungsten grows only on the interconnection layer 8 in the contact hole 10 and the contact hole 10 is filled with the contact plug 12.

Figure 3D:
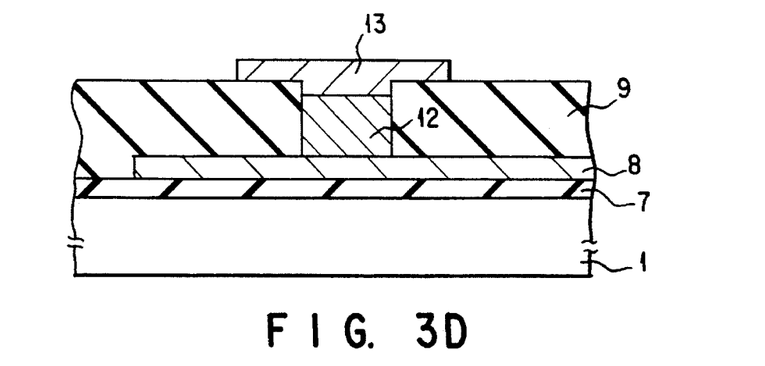

After this, metal such as Al is vapor-deposited on the inter-level insulation film 9 and the metal film is patterned to form a second-level interconnection layer 13. As a result, the first-level interconnection layer 8 and the second-level interconnection layer 13 are electrically connected to each other via the contact plug 12 to provide a contact structure as shown in FIG. 3D.

Figure 4:
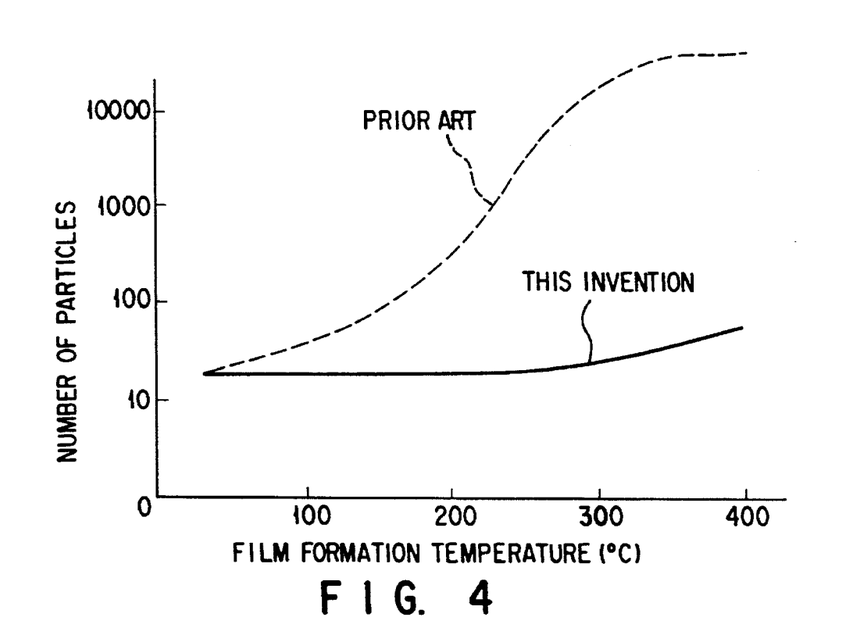
FIG. 4 is a characteristic diagram showing the relation between the film forming temperature at the time of selective CVD and the number of particles deposited on the inter-level insulation film in the contact plug forming method of this invention and the conventional contact plug forming method.

Next, the condition of particles attached to the inter-level insulation film 9 is explained with reference to FIGS. 4 and 5. FIG. 4 is a characteristic diagram showing the relation between the film forming temperature at the time of selective CVD and the number of particles deposited on the inter-level insulation film in the contact plug forming method of this invention and the conventional contact plug forming method. The abscissa indicates the film forming temperature in the selective CVD and the ordinate indicates the number of particles (/wafer) attached to the area of the inter-level insulation film which lies around the contact hole at the film forming time. Samples used for the measurement are each prepared by forming an insulation film on the surface of a wafer with a diameter of 6 inches (15.24 cm) and forming a contact hole in the insulation film. The particle is a tungsten particle with a diameter of 0.3 μm or more.

In a case where the tungsten plug is formed by the conventional method, not so much particles are attached to part of the insulation film which lies around the contact hole if the film forming temperature is set at the low temperature such as the room temperature when the contact plug is formed as indicated by broken lines, but the number of attached particles rapidly increases and the selectivity in the selective growth cannot be maintained if the film forming temperature exceeds approx. 200° C. In contrast, as indicated by a solid line, if the tungsten plug is formed by the method of this invention, the number of particles does not increase so much and the film formation can be attained with the high selectivity when the film forming temperature is equal to or lower than approx. 400° C.

Figure 5:
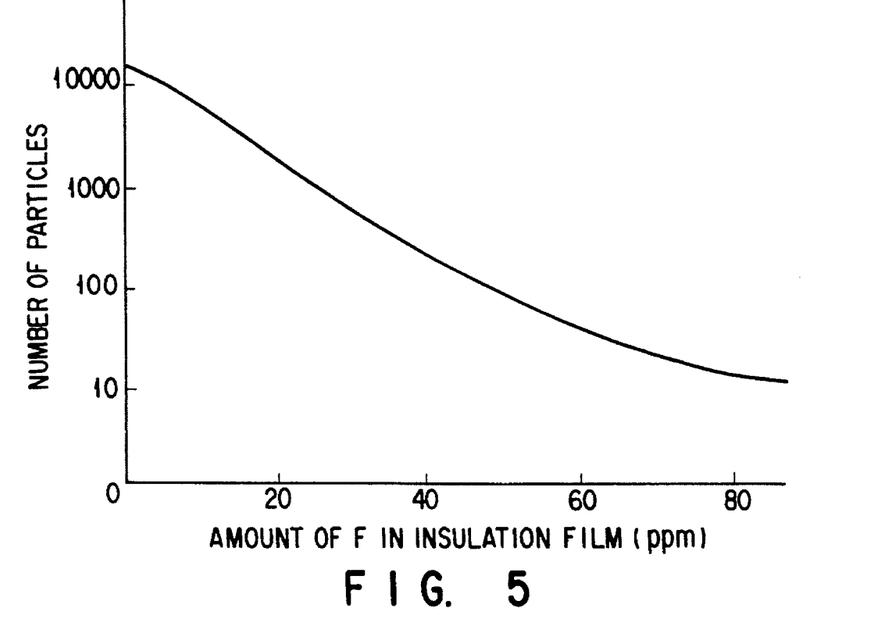
FIG. 5 is a characteristic diagram showing the relation between the number of particles and the amount of halogen attached to the inter-level insulation film in the contact plug forming method of this invention.

FIG. 5 is a characteristic diagram showing the relation between the number of particles and the amount (ppm) of F attached to the surface of an insulation film which is subjected to the process using $F_2$ gas. An $SiO_2$ film is used as the insulation film. The abscissa indicates the amount of F on the surface of the $SiO_2$ film which has been subjected to the process by use of the $F_2$ gas and the ordinate indicates the number of particles (/wafer) attached to the area of the $SiO_2$ film which lies around the contact hole at the film forming time. The particle is a tungsten particle with a diameter of 0.3 μm or more like the case of FIG. 4. As the amount of F attached to the surface of the $SiO_2$ film becomes larger, the number of attached particles becomes smaller, but when the attached amount of tungsten particles exceeds approx. 80 ppm, a significant reduction in the number of particles cannot be observed.

According to the above manufacturing method, the surface of the inter-level insulation film 9 is purified so as to make it difficult to deposit a core of plug material on the purified surface by exposing the inter-level insulation film 9 having the contact plug 12 buried therein to the gas atmosphere containing halogen. As a result, it becomes difficult for the plug material to be deposited on the surface of the inter-level insulation film 9 which is different from part of the first-level interconnection layer 8 lying in the contact hole 10 and the high selectivity can be attained even when the plug material is deposited at temperatures of approx. 400° C. Further, since the plug material can be deposited at high temperatures, the film quality of the contact plug 12 can be made uniform and a good contact characteristic between the first-level interconnection layer 8 and the second-level interconnection layer 12 can be obtained.

In the first embodiment, a BPSG film is used as the inter-level insulation film 9, but substantially the same effect can be attained when another insulation film such as a PSG (phospho-silicate glass) film, TEOS film, or $CVD-SiO_2$ film is used.

Further, as the halogen gas used in the halogen gas process, $WF_6$ gas, $NF_3$ gas, $CF_4$ gas, $C_3F_8$ gas, $CHF_3$ gas, $CH_3F_2$ gas (fluorocarbon series), $CCl_4$ gas (chlorocarbon series), $BF_3$ gas, $SF_6$ gas, HF gas, $BCl_3$ gas, $ClF_4$ gas, and $Cl_2$ gas can be used in as well as $F_2$ gas.

As the contact plug material filled in the contact hole, other metal such as aluminum, gold, molybdenum or copper can be used as well as tungsten.

Further, as the material of the first-level interconnection layer 8, silicide such as $TiSi_2$ or $WSi_2$ can be used as well as polysilicon and it is also possible to use Al.

Figure 6:
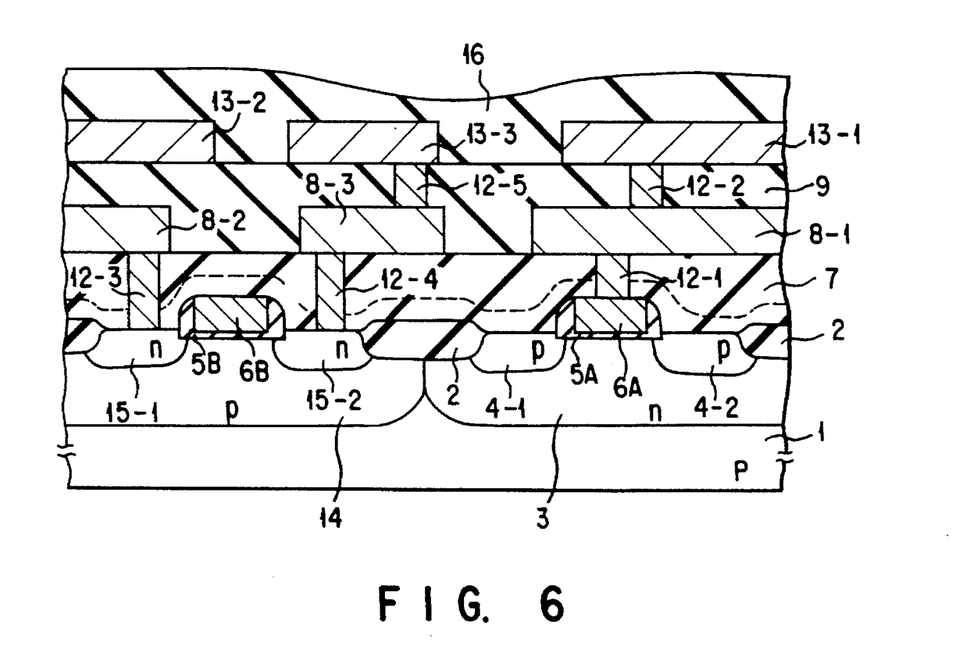
FIG. 6 is a cross sectional view of a semiconductor device to which this invention is applied.

Next, a method for forming a contact plug according to a second embodiment of this invention is explained with reference to FIG. 6 and FIGS. 7A to 7D. FIG. 6 is a cross sectional view of a semiconductor device with a CMOS structure having an N-channel MOS transistor and P-channel MOS transistor formed therein. As shown in FIG. 6, a field oxide film 2 is formed on the main surface of a P-type silicon substrate (semiconductor substrate) 1. In the semiconductor substrate 1, an N well region 3 and P well region 14 are formed, P-type source and drain regions 4-1 and 4-2 are formed in the N well region 3, and N-type source and drain regions 15-1 and 15-2 are formed in the P well region 14. A gate oxide film 5A is formed on a channel region between the source and drain regions 4-1 and 4-2 of the P-channel MOS transistor and a polysilicon gate 6A is formed on the gate oxide film 5A. A gate oxide film 5B is formed on a channel region between the source and drain regions 15-1 and 15-2 of the N-channel MOS transistor and a polysilicon gate 6B is formed on the gate oxide film 5B.

A first-level inter-level insulation film 7 such as a BPSG film is formed on the resultant structure. The surface of the inter-level insulation film 7 is made flat by the heat treatment. A first-level metal interconnection layers 8-1, 8-2, 8-3 such as laminated interconnection layers containing aluminum and titanium are formed on the inter-level insulation film 7. A second-level inter-level insulation film 9 such as a BPSG film is formed on the metal interconnection layers 8-1, 8-2, 8-3 and the inter-level insulation film 7 and the surface thereof is planarize by the heat treatment. Second-level metal interconnection layers 13-1, 13-2, 13-3 such as aluminum layers are formed on the inter-level insulation film 9. The metal interconnection layers 13-1, 13-2, 13-3 are covered with and protected by a protection insulation film 16 formed of PSG.

The first-level metal interconnection layer 8-1 and the polysilicon gate 6A of the P-channel MOS transistor are electrically connected to each other via the contact plug 12-1. The first-level metal interconnection layer 8-1 and the second-level metal interconnection layer 13-1 are electrically connected to each other via the contact plug 12-2. Further, the first-level metal interconnection layer 8-2 and the source region 15-1 of the N-channel MOS transistor are electrically connected to each other via the contact plug 12-3. The drain region 15-2 and the first-level metal interconnection layer 8-3 are electrically connected to each other via the contact plug 12-4. The first-level metal interconnection layer 8-3 and the second-level metal interconnection layer 13-3 are electrically connected to each other via the contact plug 12-5.

In the manufacturing process of the semiconductor device shown in FIG. 6, the surface of the inter-level insulation film 7 is purified by exposing the semiconductor substrate 1 to the gas atmosphere containing halogen prior to the selective growth of tungsten in the contact holes to bury the contact plugs 12-1, 12-3, 12-4 in the first-level inter-level insulation film 7. The concrete condition of the halogen gas process may be set to the same condition as in the first embodiment. Further, the surface of the inter-level insulation film 9 is purified by exposing the semiconductor substrate 1 to the gas atmosphere containing halogen prior to the selective growth of tungsten in the contact holes to bury the contact plugs 12-2, 12-5 in the second-level inter-level insulation film 9.

Figure 7A:
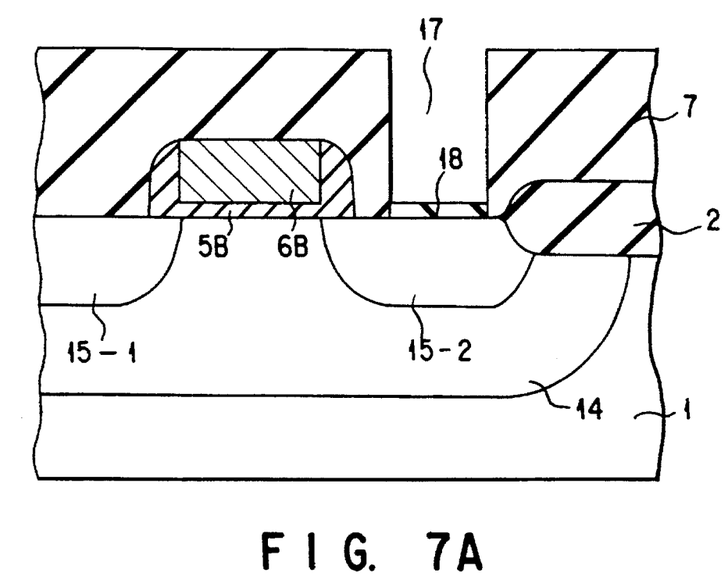
FIGS. 7A to 7D are cross sectional views sequentially showing the manufacturing steps of a contact portion between an interconnection layer and an active region of a semiconductor element of the semiconductor device shown in FIG. 6, for illustrating a contact plug forming method according to a second embodiment of this invention.
Figure 7B:
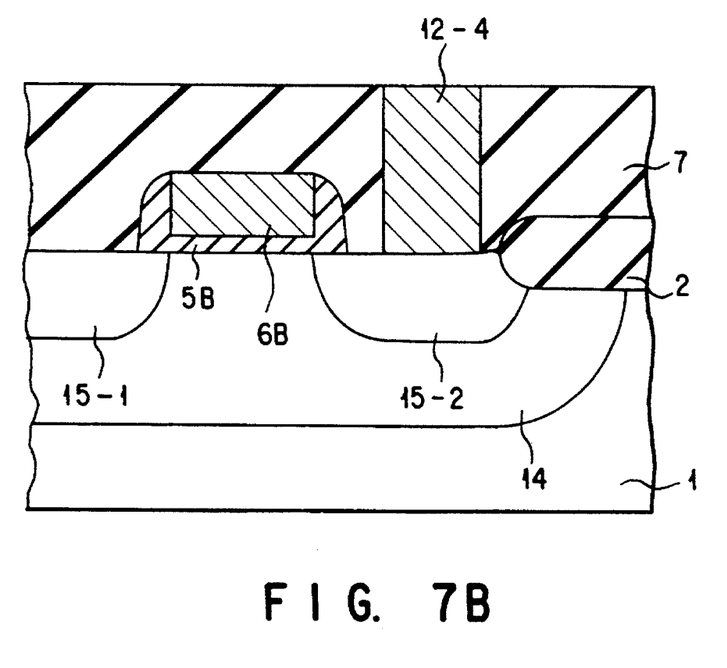

Next, the process for forming a portion which connects the first-level metal interconnection layer 8-3 and the drain region 15-2 of the N-channel MOS transistor to each other in the semiconductor device shown in FIG. 6 is explained in detail with reference to FIGS. 7A to 7D. First, as shown in FIG. 7A, a field oxide film 2, P well region 14 and N-channel MOS transistors are formed in preset portions of the P-type silicon substrate (semiconductor substrate) by the well known manufacturing method.

Next, an inter-level insulation film 7 such as a BPSG film is formed on the resultant structure. After the heat treatment is effected to make the surface of the inter-level insulation film 7 flat, a mask pattern having an opening in position corresponding to the contact hole forming area is formed on the inter-level insulation film 7 by using a photoresist. Then, the anisotropic ion-etching such as RIE is effected to selectively etch out the inter-level insulation film 7 by use of the mask pattern so as to form a contact hole 17. As a result, the drain region 15-2 is exposed at the bottom of the contact hole 17. At the time of etching, a natural oxidation film 18 is formed on the exposed surface of the impurity diffused layer (drain region 15-2) and the natural oxidation film 18 is removed by the plasma etching using halogen.

Next, the surface of the inter-level insulation film 7 is processed for about 10 sec. at temperatures of approx. 200° C. by using $F_2$ gas or $WF_6$ of approx. 10 volume % with Ar gas used as the carrier gas. After the above process, $WF_6$ is reduced by the reaction of $WF_6$ and $SiH_4$ and tungsten 12-4 is selectively grown on the drain region 15-2 of the contact hole 17 to obtain the resultant structure shown in FIG. 7B.

Figure 7C:
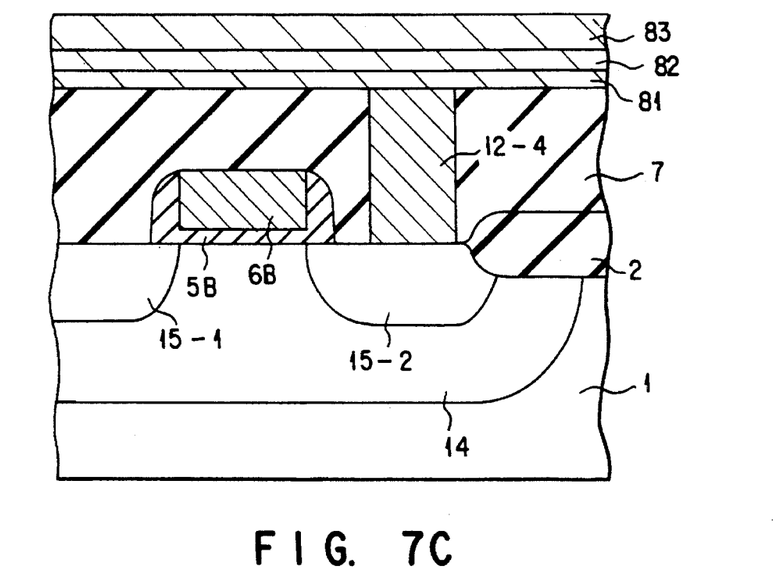

After this, as shown in FIG. 7C, a Ti layer 81, TiN layer 82 and Al—Si—Cu layer 83 are sequentially formed on the inter-level insulation film 7 by the sputtering method.

Figure 7D:
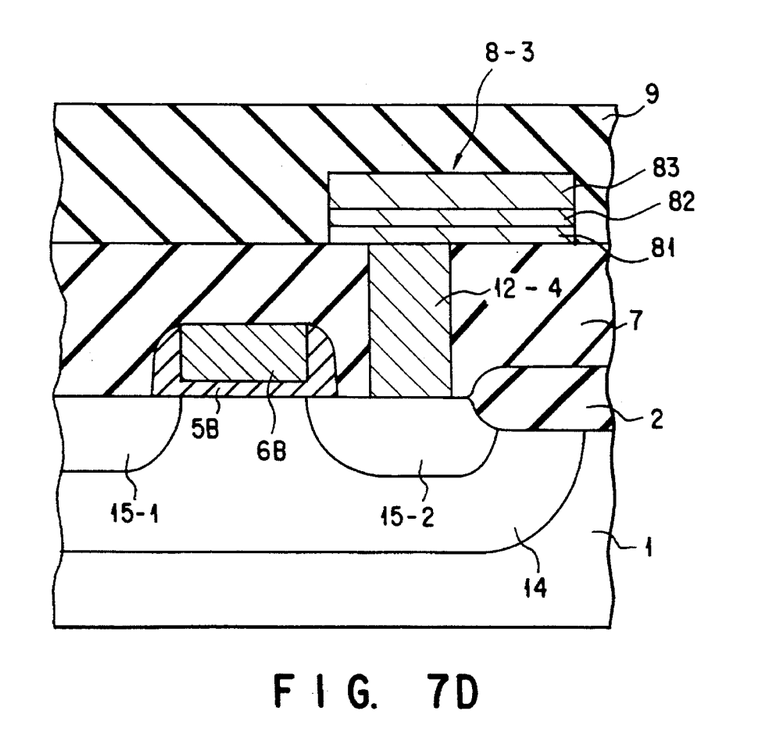

Then, a photoresist pattern is used as a mask to pattern the laminated structure according to an interconnection pattern so as to form a first-level interconnection layer 8-3 formed of Al—Si—Cu layer/TiN layer/Ti layer as shown in FIG. 7D. After this, a second-level inter-level insulation film 9 is formed on the resultant structure.

As described above, this invention can be applied not only for connection between the first-level and second-level interconnection layers but also for electrical connection between the interconnection layer and the impurity diffused layer acting as the active region of a semiconductor element formed in the semiconductor substrate via the contact plug, and the surface of the inter-level insulation film 7 can be purified by exposing the inter-level insulation film 7 having the contact plug 12-4 buried therein to the gas atmosphere containing halogen, thereby making it difficult to deposit a core of the plug material. As a result, it becomes difficult for the plug material to be deposited on the surface of the inter-level insulation film 7 which is different from part of the impurity diffused layer (drain region 15-2) lying in the contact hole 17 and the high selectivity can be attained even when the plug material is deposited at high temperatures. Further, since the plug material can be deposited at high temperatures, the film quality of the contact plug 12-4 can be made uniform and a good contact characteristic can be attained between the drain region 15-2 and the first-level interconnection layer 8-3.

This invention is not limited to the above first and second embodiments, and can be variously modified without departing from the technical scope thereof.

For example, a case wherein the first-level and second-level interconnection layers are electrically connected to each other via the contact plug is explained in the first embodiment, but the connection is not limited to the connection between the first-level and second-level interconnection layers if interconnection layers of different levels are connected via a contact plug.

Further, a case wherein the first-level interconnection layer and the drain region of the MOS transistor are electrically connected to each other via the contact plug is explained as an example of connection between the semiconductor element and the interconnection layer in the second embodiment, but the same operation and effect can be attained when this invention is applied to a structure for connecting the source region 15-1 and the first-level interconnection layer 8-2 via the contact plug 12-3 as shown in FIG. 6 or to a structure for connecting the polysilicon gate 6A and the first-level interconnection layer 8-1 via the contact plug 12-1. Further, it is, of course, possible to apply this invention to connection between the interconnection layer and another semiconductor element such as diode or capacitor other than the MOS transistor.

What is claimed is:

1. A semiconductor device manufacturing method comprising the steps of:

forming a first conductive layer;

forming an insulation film on said first conductive layer to cover said first conductive layer with said insulation film, the insulation film having an exposed surface opposite from said first conductive layer;

selectively etching said insulation film on said first conductive layer to form a contact hole through the exposed surface and expose part of said first conductive layer in said contact hole;

removing a natural oxide film from the part of said first conductive layer exposed within said contact hole by plasma etching using a halogen gas;

exposing the resultant structure to a gas atmosphere containing halogen, separately from said natural oxide removing step, to purify the exposed surface of said insulation film and thereby inhibit deposition of contact plug material thereon, at temperatures in a range between room temperature and 400° C.;

after the step of exposing the resultant structure, depositing and forming a contact plug on part of said first conductive layer exposed in said contact hole by selective chemical vapor deposition to fill in said contact hole; and forming a second conductive layer on the exposed surface of said insulation film to electrically connect said first and second conductive layers to each other via said contact plug.

2. A semiconductor device manufacturing method according to claim 1, wherein said contact plug contains refractory metal created by a reducing reaction of a compound of refractory metal.

3. A semiconductor device manufacturing method according to claim 2, wherein the temperature of the reducing reaction is set in a range of room temperature to 400° C.

4. A semiconductor device manufacturing method according to claim 1, wherein, during exposing the resulting structure, the gas containing halogen contains an inert gas as a carrier gas.

5. A semiconductor device manufacturing method according to claim 1, wherein, during exposing the resulting structure, the gas containing halogen contains at least one gas selected from a group consisting of $F_2$, $WF_6$, $NF_3$, $CF_4$, $C_3F_8$, $CHF_3$, $CH_3F_2$, $CCl_4$, $BF_3$, $SF_6$, HF, $BCl_3$, $ClF_4$ and $Cl_2$.

6. A semiconductor device manufacturing method according to claim 1, wherein said contact plug contains at least one material selected from a group consisting of tungsten, aluminum, gold, molybdenum and copper.

7. A semiconductor device manufacturing method according to claim 1, wherein said first conductive layer is selected from a group consisting of polysilicon, silicide, aluminum and impurity diffused layer.

8. A semiconductor device manufacturing method according to claim 1, wherein said second conductive layer is selected from a group consisting of polysilicon, silicide and aluminum.

9. A semiconductor device manufacturing method according to claim 1, wherein said insulation film is selected from a group consisting of boro-phospho silicate glass, phospho-silicate glass, tetraethyl orthosilicate and chemical vapor deposited-$SiO_2$.

10. A semiconductor device manufacturing method comprising the steps of:

forming a first insulation film on a semiconductor substrate;

forming a first-level interconnection layer on said first insulation film;

forming a second insulation film on said first insulation film and first-level interconnection layer, the second insulation film having an exposed surface opposite from said first-level interconection layer;

selectively etching part of said second insulation film which lies on said first-level interconnection layer to form a contact hole through the exposed surface and expose part of said first-level interconnection layer in said contact hole;

removing a natural oxide film from the part of said first-level interconnection layer exposed within said contact hole by plasma etching using a halogen gas;

exposing said semiconductor substrate to a gas atmosphere containing halogen, separately from said natural oxide removing step, to purify the exposed surface of said second insulation film and thereby inhibit deposition of contact plug material thereon, at temperatures in a range between room temperature and 400° C.;

after the step of exposing said semiconductor substrate, depositing and forming a contact plug formed of refractory metal created by a reducing reaction of a compound of refractory metal on part of said first-level interconnection layer which is exposed in said contact hole to fill in said contact hole; and forming a second-level interconnection layer on said second insulation film to electrically connect said first-level and second-level interconnection layers to each other via said contact plug.

11. A semiconductor device manufacturing method according to claim 10, wherein the temperature of the reducing reaction is set in a range of room temperature to 400° C.

12. A semiconductor device manufacturing method according to claim 10, wherein, during the step of exposing the semiconductor substrate, the gas containing halogen contains an inert gas as a carrier gas.

13. A semiconductor device manufacturing method according to claim 10, wherein, during the step of exposing the semiconductor substrate, the gas containing halogen contains at least one gas selected from a group consisting of $F_2$, $WF_6$, $NF_3$, $CF_4$, $C_3F_8$, $CHF_3$, $CH_3F_2$, $CCl_4$, $BF_3$, $SF_6$, HF, $BCl_3$, $ClF_4$ and $Cl_2$.

14. A semiconductor device manufacturing method comprising the steps of:

forming an impurity diffused layer in a semiconductor substrate;

forming an insulation film on said semiconductor substrate;

selectively etching part of said insulation film which lies on said impurity diffused layer to form a contact hole and expose part of said impurity diffused layer in said contact hole;

removing a natural oxide film from the part of said impurity diffused layer exposed within said contact hole by plasma etching using a halogen gas;

exposing said semicondutor substrate to a gas atmosphere containing halogen, separately from said natural oxide removal step, to purify an exposed surface of said insulation film and thereby inhibit deposition of contact plug material thereon, at temperatures in a range between room temperature and 400° C.;

after the step of exposing said semiconductor substrate, depositing and forming a contact plug formed of refractory metal created by a reducing reaction of a compound of refractory metal on part of said impurity diffused layer which is exposed in said contact hole to fill in said contact hole; and forming an interconnection layer on said insulation film to electrically connect said impurity diffused layer and said interconnection layer to each other via said contact plug.

15. A semiconductor device manufacturing method according to claim 14, further comprising a step of forming a semiconductor element in said semiconductor substrate.

16. A semiconductor device manufacturing method according to claim 14, wherein said impurity diffused layer is part of an active region of a semiconductor element.

17. A semiconductor device manufacturing method according to claim 14, wherein the temperature of the reducing reaction is set in a range of room temperature to 400° C.

18. A semiconductor device manufacturing method according to claim 14, wherein, during the step of exposing the semiconductor substrate, the gas containing halogen contains an inert gas as a carrier gas.

19. A semiconductor device manufacturing method according to claim 14, wherein, during the step of exposing the semiconductor substrate, the gas containing halogen contains at least one gas selected from a group consisting of $F_2$, $WF_6$, $NF_3$, $CF_4$, $C_3F_8$, $CHF_3$, $CH_3F_2$, $CCl_4$, $BF_3$, $SF_6$, $HF$, $BCl_3$, $ClF_4$ and $Cl_2$.

* * * * *